(12) United States Patent
Hirose et al.

(10) Patent No.: US 8,908,438 B1
(45) Date of Patent: *Dec. 9, 2014

(54) FLASH MEMORY DEVICES AND SYSTEMS

(71) Applicant: Cypress Semiconductor Corporation, San Jose, CA (US)

(72) Inventors: Ryan Tasuo Hirose, Colorado Springs, CO (US); Bogdan I. Georgescu, Colorado Springs, CO (US); Ashish Ashok Amonkar, Santa Clara, CA (US); Vijay Raghavan, Colorado Springs, CO (US); Cristinel Zonte, Colorado Springs, CO (US); Sean B. Mulholland, Colorado Springs, CO (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/066,431

(22) Filed: Oct. 29, 2013

Related U.S. Application Data

(63) Continuation of application No. 13/340,091, filed on Dec. 29, 2011, now Pat. No. 8,570,809.

(60) Provisional application No. 61/566,197, filed on Dec. 2, 2011.

(51) Int. Cl.
| | |
|---|---|
| *G11C 16/04* | (2006.01) |
| *H01L 29/792* | (2006.01) |
| *G11C 16/06* | (2006.01) |
| *G11C 16/30* | (2006.01) |
| *G11C 16/34* | (2006.01) |

(52) U.S. Cl.
CPC .......... *G11C 16/0466* (2013.01); *H01L 29/792* (2013.01); *G11C 16/06* (2013.01); *G11C 16/30* (2013.01); *G11C 16/3418* (2013.01)

USPC ............. 365/185.18; 365/185.29; 365/189.09

(58) Field of Classification Search
CPC ........... G11C 16/0483; G11C 16/0466; G11C 16/06; G11C 16/10; G11C 16/30; G11C 16/3418
USPC ............. 365/185.18, 185.17, 185.11, 185.29, 365/189.09, 189.11; 257/324, 325
See application file for complete search history.

(56) References Cited

U.S. PATENT DOCUMENTS

| | | |
|---|---|---|
| 6,407,949 B1 | 6/2002 | Jha et al. |
| 6,445,030 B1 | 9/2002 | Wu et al. |

(Continued)

OTHER PUBLICATIONS

USPTO Non Final Rejection for U.S. Appl. No. 13/340,091 dated Jun. 7, 2013; 6 pages.

(Continued)

*Primary Examiner* — Gene Auduong

(57) ABSTRACT

Flash memory devices and systems are provided. One flash memory device includes an n-channel metal oxide semiconductor field-effect transistor (nMOSFET), a silicon-oxide-nitride-oxide silicon (SONOS) transistor coupled to the nMOSFET, and an isolated p-well coupled to the nMOSFET and the SONOS transistor. A flash memory system includes an array of memory devices divided into a plurality of paired sectors, a global bit line (GBL) configured to provide high voltage to each respective sector during erase and program operations coupled to each of the plurality of sectors, and a plurality of sense amplifiers coupled between a respective pair of sectors. Methods for operating a flash memory are also provided. One method includes providing high voltage, via the GBL, to the paired sectors during erase and program operations and providing low voltage, via a local bit line, to each memory device during read operations.

20 Claims, 4 Drawing Sheets a - (1) / (2); 1) Select, 2) De-select
b - (1) / (2) / (3); 1) Select, 2) De-select, 3) In de-select sector
c - Boost circuit

(56) References Cited

U.S. PATENT DOCUMENTS

| | | | |
|---|---|---|---|
| 7,053,448 B2 | 5/2006 | Jeon et al. | |
| 7,280,397 B2 | 10/2007 | Scheuerlein | |
| 7,463,547 B2 | 12/2008 | Nakatsu et al. | |
| 7,495,283 B2 | 2/2009 | Wu | |
| 7,615,821 B2 | 11/2009 | Sim et al. | |
| 7,688,648 B2 | 3/2010 | Kim | |
| 7,864,588 B2 * | 1/2011 | Betser et al. | 365/185.2 |
| 7,948,799 B2 | 5/2011 | Lue et al. | |
| 7,957,200 B2 | 6/2011 | Hibino | |
| 8,274,829 B2 | 9/2012 | Lee et al. | |
| 8,289,775 B2 * | 10/2012 | Lee et al. | 365/185.18 |
| 8,570,809 B2 * | 10/2013 | Hirose et al. | 365/185.18 |
| 2007/0195607 A1 * | 8/2007 | Eitan et al. | 365/185.24 |
| 2009/0316487 A1 | 12/2009 | Lee et al. | |
| 2010/0296347 A1 | 11/2010 | Park et al. | |
| 2011/0075486 A1 | 3/2011 | Liao et al. | |

OTHER PUBLICATIONS

USPTO Notice of Allowance for U.S. Appl. No. 13/340,091 dated Sep. 4, 2013; 8 pages.

Wang, N., et al., "A million cycle 0.13um 1Mb embedded SONOS Flash memory using Successive Approximated Read Calibration", Custom Integrated Circuits Conference, 2008.

Xuguang Wang, et al., "A novel high-K SONOS memory using TaN/Al2O3/Ta2O5/HfO2/Si structure for fast speed and long retention operation", IEEE Transactions on Electron Devices, vol. 53, Issue 1, dated Jan. 2006; pp. 78-82.

* cited by examiner

FLASH MEMORY DEVICES AND SYSTEMS

This application is a continuation of U.S. application Ser. No. 13/340,091, filed Dec. 29, 2011, now U.S. Pat. No. 8,570,809, issued Oct. 29, 2013, which claims the benefit of U.S. Provisional Application No. 61/566,197, filed on Dec. 2, 2011, each of which is incorporated by reference herein in its entirety.

BACKGROUND OF THE INVENTION

1. Field of the Invention

The present invention relates generally to memory devices, and more particularly to, flash memory devices and flash memory systems.

2. Description of the Related Art

Contemporary flash memory devices and systems are less efficient than they otherwise could be. One reason for this inefficiency lies in the fact that the flash memory devices are arranged in a single array or independent smaller arrays, which operate at larger biases for typical "read" operations. For example, some known previous flash memory devices and systems require a voltage in the range of 1.8 volts to 5 volts to power the single array(s).

In addition, previous flash memory device and systems are slower than they otherwise could be. A reason for the increase time to perform their functions is due to the fact that these previous flash memory device and systems read data via a global bit line (GBL) to a sense amplifier (SA). Furthermore, performing read operations via the GBL to the SA increases parasitic loading that further limits the speed of read operations. Therefore, faster and more efficient flash memory devices and systems are desirable.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict only typical embodiments of the invention and are not therefore to be considered to be limiting of its scope, the invention will be described and explained with additional specificity and detail through the use of the accompanying drawings, in which.

DETAILED DESCRIPTION OF THE DRAWINGS

Figure 1:
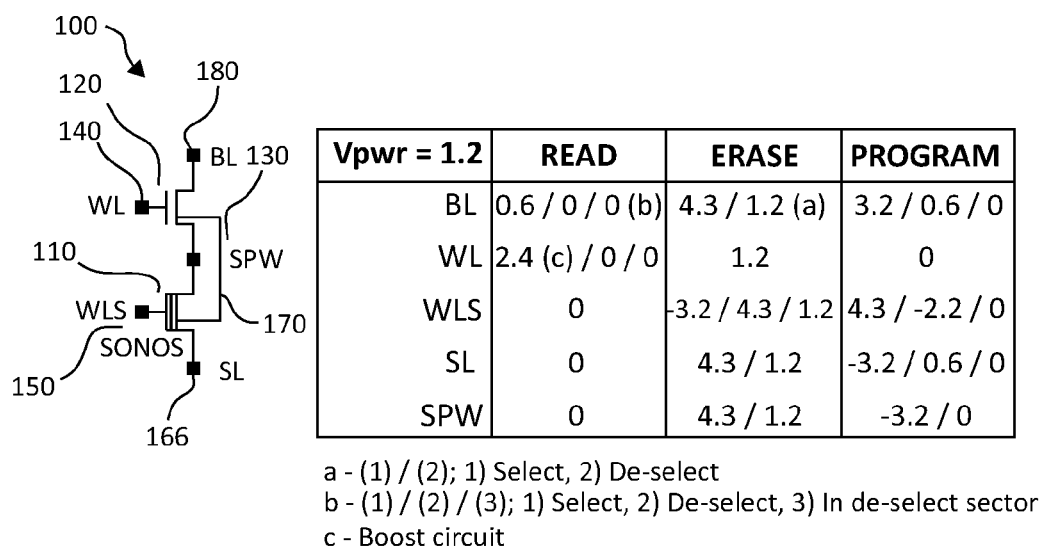
FIG. 1 is a schematic diagram of one embodiment of a memory cell.

Reference in the description to "one embodiment" or "an embodiment" means that a particular feature, structure, or characteristic described in connection with the embodiment is included in at least one embodiment of the invention. The phrase "in one embodiment" located in various places in this description does not necessarily refer to the same embodiment.

In the following detailed description, for purposes of explanation, numerous specific details are set forth in order to provide a thorough understanding of the subject matter of the present application. It will be evident, however, to one skilled in the art that the disclosed embodiments, the claimed subject matter, and their equivalents may be practiced without these specific details.

The detailed description includes references to the accompanying drawings, which form a part of the detailed description. The drawings show illustrations in accordance with example embodiments. These embodiments, which may also be referred to herein as "examples," are described in enough detail to enable those skilled in the art to practice the embodiments of the claimed subject matter described herein. The embodiments may be combined, other embodiments may be utilized, or structural, logical, and electrical changes may be made without departing from the scope and spirit of the claimed subject matter. It should be understood that the embodiments described herein are not intended to limit the scope of the subject matter but rather to enable one skilled in the art to practice, make, and/or use the subject matter.

The various embodiments described herein include memory circuits and memory systems. One memory circuit comprises an active memory device, an inactive memory device, and a sense amplifier coupled between the active memory device and the inactive memory device. The memory circuit further comprises a reference current is coupled between the inactive memory device and the sense amplifier. In various embodiments, the active memory device and the inactive memory device are the same type of memory device and the inactive memory device is a reference memory device with respect to leakage currents and parasitic loading in the active memory device.

One memory system comprises a plurality of memory circuits coupled to one another. Here, each memory circuit comprises an active memory device, an inactive memory device, and a sense amplifier coupled between the active memory device and the inactive memory device. The memory circuit further comprises a reference current is coupled between the inactive memory device and the sense amplifier. In various embodiments, the active memory device and the inactive memory device are the same type of memory device and the inactive memory device is a reference memory device with respect to leakage currents and parasitic loading in the active memory device.

Various other embodiments provide methods for sensing current in a memory circuit. One method comprises supplying power to a first memory device and comparing the amount of current in the first memory device and a reference current coupled to a second memory device that is the same type of memory device as the first memory device.

Turning now to the figures, FIG. 1 is a schematic diagram of one embodiment of a memory cell 100. At least in the illustrated embodiment, memory cell 100 comprises a silicon-oxide-nitride-oxide-silicon (SONOS) transistor 110, an n-channel metal oxide semiconductor field-effect transistor (nMOSFET) 120, and an isolated sector p-well (SPW) 130 coupled to SONOS transistor 110 and nMOSFET 120.

SONOS transistor 110 comprises a source coupled to a vertical source line (SL) and a gate coupled to a horizontal SONOS word line (WLS). In addition, SONOS transistor 110 comprises a drain coupled nMOSFET 120.

nMOSFET 120 comprises a source coupled to the drain of SONOS transistor 110. nMOSFET further comprises a gate coupled to a horizontal word line (WL) and a drain connected to a vertical bit line (BL).

Memory cell 100 further comprises a voltage input 140 coupled to the WL, a voltage input 150 coupled to the WLS, a voltage input 160 coupled to the SL, and a voltage input 170 coupled to SPW 130. In addition, memory cell 100 comprises a current output 180 coupled to the BL.

Figure 2:
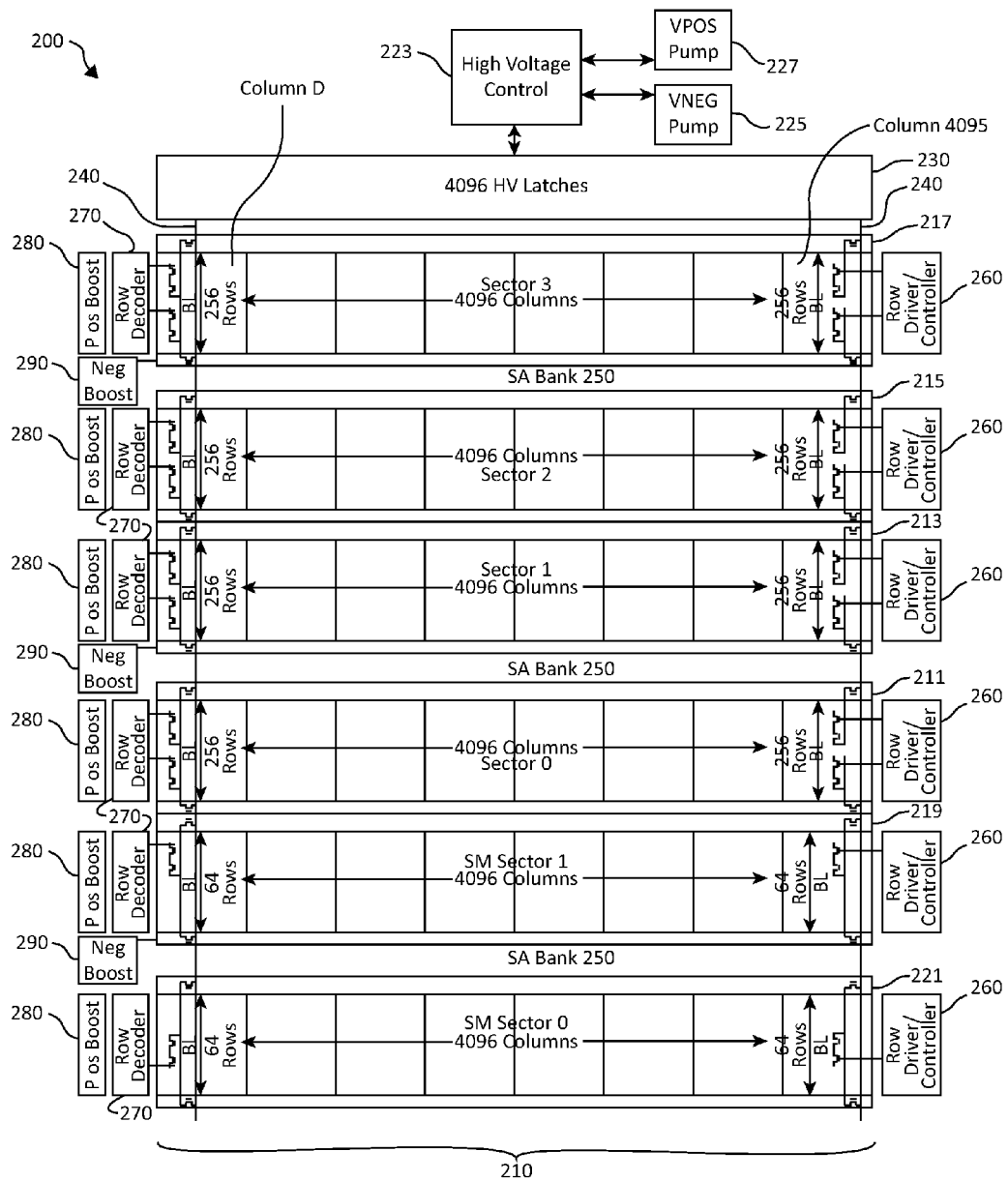
FIG. 2 is a block diagram of one embodiment of a flash memory system.

With reference now to FIG. 2, FIG. 2 is a block diagram of one embodiment of a flash memory system 200 (e.g., non-volatile (NV) memory). At least in the illustrated embodiment, flash memory system 200 comprises an array of memory cells 100 (see FIG. 1) comprising a plurality of sectors 210 (individually labeled herein as sector 211, sector 213, sector 215, sector 217, sector 219, and sector 221) each coupled to a high voltage (HV) positive voltage pump (VPOS) 227 and a negative voltage pump 225 via a high voltage control 223 that is coupled to a plurality of WLS row drivers/controllers 260 and to a bank of high voltage latches 230 that drive and a plurality of GBLs 240.

While FIG. 2 illustrates flash memory system comprising six (6) sectors 210 (sector 211, sector 213, sector 215, sector 217, sector 219, and sector 221), flash memory system 200 may include any number of sectors 210 depending on the needs and/or application of flash memory system 200. In various embodiments, flash memory system 200 comprises a number of sectors 210 in the range of two (2) sectors 210 to sixty-four (64) sectors 210 and, in one embodiment, flash memory system 200 comprises sixteen (16) sectors 210.

Sectors 210 are arranged into a plurality of paired sectors. In the embodiment illustrated in FIG. 2, sector 211 and sector 213 form a first pair of sectors, sector 215 and sector 217 form a second pair of sectors, and sector 219 and sector 221 form a third pair of sectors.

In the embodiment illustrated in FIG. 2, sector 211, sector 213, sector 215, and sector 217 perform the normal memory operations (e.g., program, erase, and read operations) of flash memory system 200, while sector 219 and sector 221 are supervisory memory (SM) sectors. Sector 211, sector 213, sector 215, and sector 217 (i.e., the non-SM sectors) may each comprise any number of rows of memory devices 100 depending on the needs and/or application of flash memory system 200. In one embodiment, sector 211, sector 213, sector 215, and sector 217 each comprise a number of rows in the range of two (2) rows to one-thousand twenty-four (1024) rows of memory devices 100. In one embodiment, sector 211, sector 213, sector 215, and sector 217 each comprise two-hundred fifty-six (256) rows of memory devices 100, which, by including two-hundred fifty-six (256) rows of memory devices 100, limits the amount of column leakage during read operations and decreases the number of endurance issues during erase and program operations since high voltage can be confined within any sector.

Sector 211, sector 213, sector 215, and sector 217 may also comprise any number of columns of memory devices 100 depending on the needs and/or application of flash memory system 200. In various embodiments, sector 211, sector 213, sector 215, and sector 217 may each comprise a number of columns in the range of eight (8) columns to sixteen-thousand three-hundred eighty-four (16384) columns of memory devices 100 and, in one embodiment, sector 211, sector 213, sector 215, and sector 217 each comprise four-thousand ninety-six (4096) columns of memory devices 100.

Sector 219 and sector 221 (i.e., the SM sectors) are utilized to configure and/or manage flash memory 200 (i.e., sector 211, sector 213, sector 215, sector 217, SM sector 219, and SM sector 221) and/or paired sectors (i.e., paired sectors 211/213, paired sectors 215/217, and paired SM sectors 219/221). Sector 219 and sector 221 may each comprise any number of rows of memory devices 100 depending on the needs and/or application of flash memory system 200. In various embodiments, sector 219 and sector 221 each comprise a number of rows in the range of two (2) rows and one-thousand twenty-four (1024) rows and, in one embodiment, sector 219 and sector 221 each comprise sixty-four (64) rows of memory devices 100.

Sector 219 and sector 221 may also comprise any number of columns of memory devices 100 depending on the needs and/or application of flash memory system 200. In various embodiments, sector 219 and sector 221 each comprise a number of columns in the range of eight (8) columns to sixteen-thousand three-hundred eighty-four (16384) columns of memory devices 100 and, in one embodiment, sector 219 and sector 221 each comprise four-thousand ninety-six (4096) columns of memory devices 100.

In one embodiment, sector 219 and sector 221 each comprise the same number of columns as the non-SM sectors (i.e., sector 211, sector 213, sector 215, and sector 217 in the embodiment illustrated in FIG. 2). In another embodiment, sector 219 and sector 221 each comprise the same number of columns as the non-SM sectors, but include a different number of rows. In yet another embodiment, sector 219 and sector 221 each comprise the same number of rows and columns as the non-SM sectors.

In one embodiment, sector 211, sector 213, sector, 215, sector 217, sector 219, and sector 221 each spans across the array, as does the rows of memory devices 100 within each sector 210, with each row including a number of memory devices 100 equal to the number of columns in each sector 210. The columns in each sector 210 run vertically and comprise the height of each sector 210 and, in one embodiment; each column includes the same number of memory cells 100 as the rows in each sector 210.

High voltage control 223 may be any system and/or device capable of controlling an amount of voltage provided to sectors 210. Specifically, high voltage control 223 is configured to control VNEG pump 225 and VPOS pump 227 that are providing negative voltage and positive voltage, respectively, to the bank of high voltage latches 230 and to a plurality of WLS row drivers/controller 260 whose voltage is dynamically increased/decreased depending on whether flash memory system 200 is performing a program operation, an erase operation, or a read operation.

Bank of high voltage latches 230 comprises the same number of high voltage latches 2310 (not shown in FIG. 2) as columns of memory devices 100 in each sector 210. For example, if each sector 210 comprises four thousand ninety-six (4096) columns, bank of high voltage latches 230 comprises four thousand ninety-six (4096) high voltage latches 2310. Each high voltage latch 2310 is coupled to each row of memory devices 100 in its respective column within the sectors 210 and is configured to provide the rows of memory devices 100 in each column of each sector 210 with high voltage via a respective GBL 240.

Each GBL 240 is configured to provide high voltage to memory devices 100 during program operations and erase operations, but not during read operations. Furthermore, each GBL 240 is coupled to a high voltage latch 2310 and each row of memory devices 100 in each sector 210 along a particular column during high voltage operations. Specifically, a particular GBL 240 is coupled along a column of memory devices 100 in each of sectors 211, 213, 215, 217, 219, and 221 and the particular GBL 240 is coupled to each row of memory devices 100 within that column of memory devices 100 in each one of sectors 211, 213, 215, 217, 219, and 221.

For example, a GBL 240 for a column 0 will be coupled to each row of memory devices in column 0 in each of sectors 211, 213, 215, 217, 219, and 221. Thus, as illustrated in the embodiment of FIG. 2, the GBL 240 for column 0 is coupled to and provides high voltage for each row of memory devices 100 in sectors 211, 213, 215, 217, 219, and 221 that are located in column 0 of sectors 211, 213, 215, 217, 219, and 221. Specifically, the GBL 240 for column 0 is coupled to the two hundred fifty-six (256) rows of memory devices 100 in column 0 of sectors 211, 213, 215, and 217 and coupled to the sixty-four (64) rows of memory devices 100 in column 0 of sectors 219 and 221.

Each GBL 240 is coupled to one or more sectors 210 depending on the mode (e.g., program or erase) flash memory system is operating in. Furthermore, a plurality of BLs from columns of each corresponding column in the paired sector is coupled to a sense amplifier 250 for sensing purposes.

Each BL of each column in each pair of sectors 210 is coupled to a bank of sense amplifiers 250 configured to sense the amount of current in the columns in each respective sector 210 within the paired sector and to drive a common output bus (Dout). Each sense amplifier 250 may be coupled between any number of corresponding column BLs within the pair of sectors 210. In the embodiment illustrated in FIG. 2, each sense amplifier 250 is coupled to thirty-two columns of memory devices 100 in the paired sectors such that each bank comprises one hundred twenty-eight (128) sense amplifiers 250 (i.e., 4096 columns divided by 32 columns per sense amplifier equals 128 sense amplifiers (4096/32=128)). When, for example, embodiments of flash memory system 200 utilize a greater number of columns per sense amplifier 250, each bank of sense amplifiers 250 will include a fewer number of sense amplifiers 250 than the embodiment illustrated in FIG. 2. Conversely, when embodiments of flash memory system 200 utilize a fewer number of columns per sense amplifier 250, each bank of sense amplifiers 250 will include a greater number of sense amplifiers 250 than the embodiment illustrated in FIG. 2. Furthermore, other embodiment of flash memory system 200 may include a greater number, a smaller number, or the same number of sense amplifiers 250 in each bank depending on the number of columns in each sector 210 and the number of columns per sense amplifier 250 is utilized.

Each WLS row driver/controller 260 is coupled to the gate of each SONOS transistor 110 (see FIG. 3) in each row of a respective sector 210. WLS row drivers/controllers 260 are configured to drive the WLS of each memory cell 100 in each row of a respective sector 210 during program operations and erase operations by providing high voltage to each WLS.

Row decoders 270 are coupled to the gate of each nMOSFET 120 (see FIG. 1) in each row of a respective sector 210. Each row decoder 270 is configured to drive the WL of each memory cell 100 in each row of a respective sector 210 during read operations by providing a voltage to each WL. Each WL is driven by a row decoder 270 above the Vpwr rail to overcome the threshold of the nMOSFET 110 in each memory cell 100. As illustrated in FIG. 2, each row decoder 270 is coupled to a positive booster 280.

Positive boosters 280 may each be any system and/or device capable of boosting the positive voltage of the row decoder 270 with which they are respectively associated. As a result of positive boosters 280 boosting the positive voltage of a row decoder 270, row decoders 280 are able to drive WL above the Vpwr rail.

Figure 3:
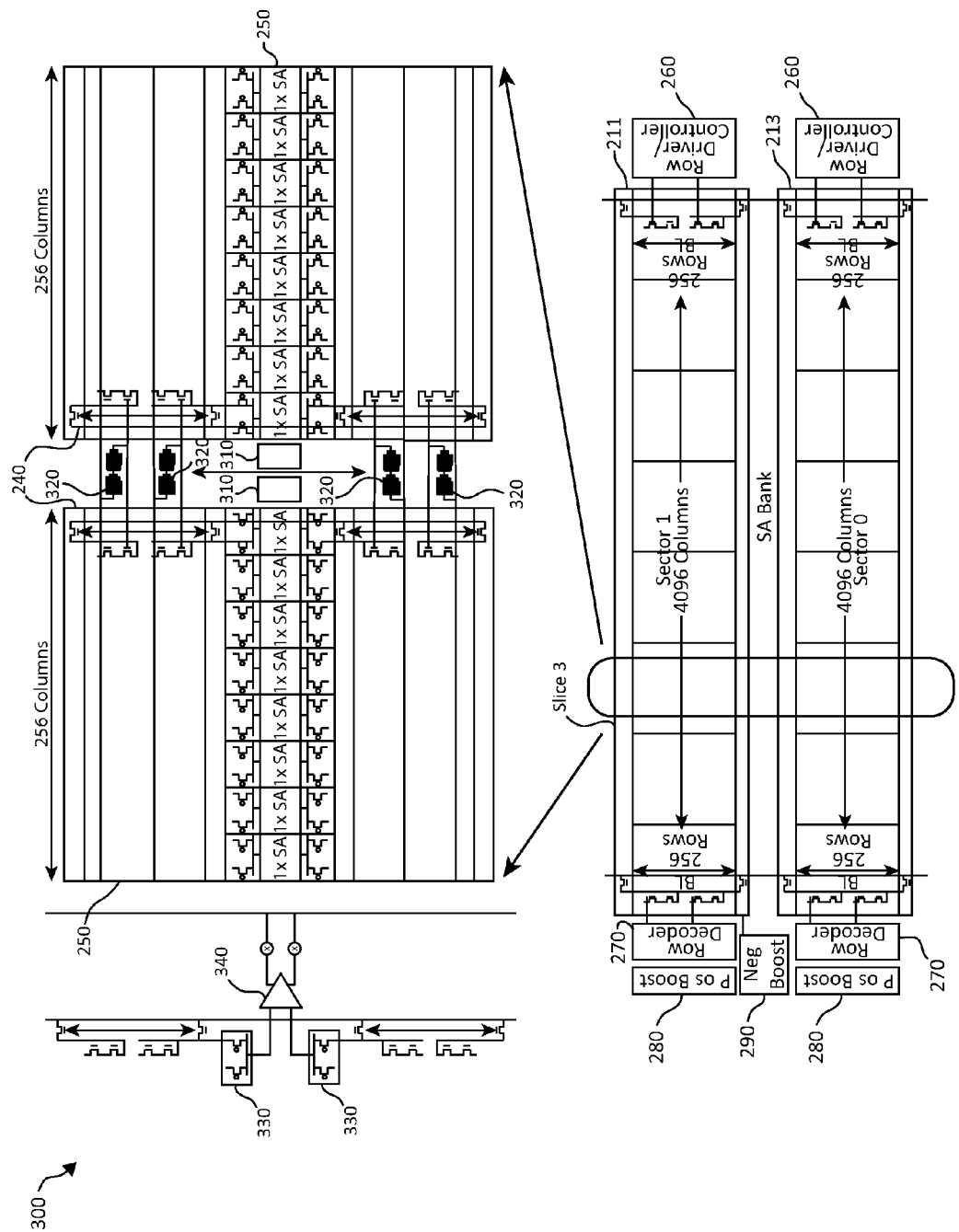
FIG. 3 is a block diagram of a paired sector of memory devices in the flash memory system of FIG. 2.

Negative boosters 290 are coupled to a pMOSFET column multiplexer circuit (CMUX) 330 (see FIG. 3). Negative boosters 290 are configured to provide negative voltage to (e.g., drive) CMUXs 330 during read operations.

Referring to FIG. 3, FIG. 3 illustrates a pair of sectors 210 in flash memory system 200. In FIG. 3, a sector 210 is further sub-divided into eight slices per sector 210, which gives 512 columns for this 4096-column example. In the upper section of FIG. 3, the left column is the leftmost column of the third slice from sector 211 and sector 213, and the right column is the rightmost column of the third slice from sector 211 and sector 213. Also down the vertical center of each slice (not shown in sector 211 and sector 213, but shown in upper portion of FIG. 3) is WL driver circuits 320 and a tri-state data multiplex (DMUX) circuit 310 that multiplexes the outputs of each sense amplifier 250 onto its respective Dout line.

As shown in FIG. 3, outputs of sixteen (16) sense amplifiers 250 are connected through a DMUX 310 to sixteen (16) Dout lines that run in the vertical center of each slice. The Dout lines then connect to the tri-state outputs of the bank of sense amplifiers 250 in the other sector 210. Where the Dout lines run vertically are WL buffers 320 that buffer a global word-line (GWL) signal and applies its output to the WL of the memory devices 100 for that row. By doing this the GWL output of row decoders 270 are lightly loaded with metal parasitic loading and the eight (8) buffers 320 from each slice in sector 210. As discussed above, the GWL and WL signals are positively boosted to overcome threshold/headroom issues and to improve the speed of the row path.

In addition, one path from a single bitline to the input of sense amplifier 340 in each CMUX 330 for sector 211 and sector 213 are both "ON" during sensing with one row enabled via the WL in either sector 211 or sector 213. Each CMUX 330 is configured to multiplex one of 32 local BLs onto a single input for differential sense amplifer 340 and negative boosters 290 are configured to provide negative voltage to (e.g., drive) CMUXs 340 during sensing operations.

The input loading on each input of differential sense amplifier 340 is matched with similar CMUX 330 and similar local BL with two hundred fifty-six (256) WL "OFF" on one side and two hundred fifty-five (255) WL "OFF" on the other side and exact or nearly exact parasitic loading. Furthermore, when sensing data on the positive input of differential sense amplifier 340, the true output of differential sense amplifier 340 drives Dout and when sensing data on the negative input of differential sense amplifier 340, the bar output of differential sense amplifier 340 drives Dout.

The following explanation of the operation of memory devices 100 and/or flash memory system 200 may be helpful in understanding the various embodiments of memory devices 100 and/or flash memory system 200. However, memory devices 100 and/or flash memory system 200 are not limited to the following explanation.

When operating, loading from SONOS transistor 110 during reads from de-selected rows are eliminated, which increases the speed and reduces read disturbs of SONOS transistor 110 from the BL read bias that may exist when reading the selected row. In addition, the WL is boosted or connected to a pumped voltage during read operations so the source of nMOSFET 120 can be driven high enough from the BL for sufficient $V_{DS}$ across SONOS transistor 110 to allow adequate current to flow if SONOS transistor 110 is in the erased state. The gate of nMOSFET 120 connects to the WL that is selected during read operations and the gate of SONOS transistor 110 connects to the WLS that is biased with high voltage from GBL during erase and program operations.

Specifically, flash memory system 200 utilizes BL segment sector architecture where the biases of the de-selected sector are shown as the third bias voltage whenever appropriate (see FIG. 1). In one embodiment, the BL voltage is at or about 0.6V for selected columns and at 0V for both de-selected columns in the selected sectors and all columns in a de-selected sector 210 during a read operation. The WL voltage is at or about 2.4V with about 0V on each remaining WL during the read operation.

For an erase operation, the BL voltage for each BL in the selected sector is at or about 4.3V (output of VPOS pump 227) and is at or about 1.2V for each BL in the de-selected sectors. The WLS voltage is at or about −3.2V (output of VNEG pump 225) for the row(s) that is/are being erased and is at or about 4.3V for the de-selected rows in the selected sector. The WLS voltage for the WLS in each de-selected sector is at or about 1.2V or is approximately equal to the power supply level (Vpwr). The SL and SPW each include the same bias voltage as the BL during erase operations.

In a program operation, the BL and SL in the selected sector can either be at or about −3.2V to program memory devices 100 in a column or at an inhibit voltage (Vinh) between about 0V and Vpwr to inhibit the programming of a memory cell 100 on that column, although Vinh may be marginally below 0V and marginally above Vpwr. The voltage of BL and SL in de-selected sectors is at or about 0V. The WLS voltage for the row(s) that is/are being programmed is at or about 4.3V and for de-selected rows in the selected sector the WLS voltage is at or about −2.2V. This voltage during program operations for the de-selected WLS in selected sector 210 is utilized to reduce the WLS to BL differential when the BL is at the Vinh potential so that program disturbs are minimized. The WLS voltage in each de-selected sector is at or about 0V and the SPW voltage is at or about −3.2V for selected sectors and about 0V for de-selected sectors.

Figure 4:
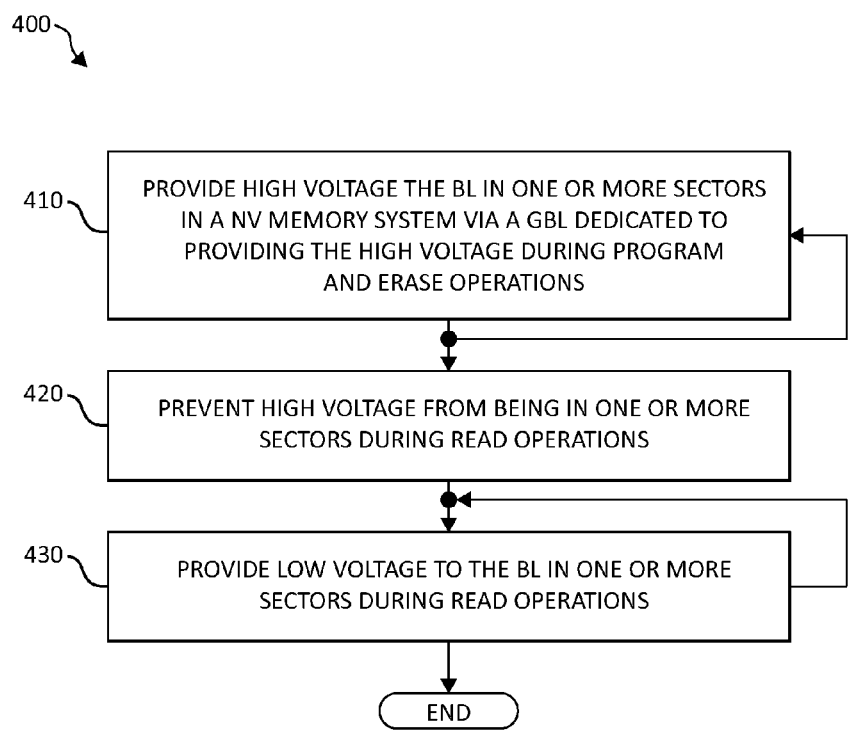
FIG. 4 is a flow diagram of one embodiment of a method for operating a flash memory system.

Turning now to FIG. 4, FIG. 4 is a flow diagram of one embodiment of a method 400 for operating a flash memory system (e.g., flash memory system 200). At least in the illustrated embodiment, method 400 begins by providing high voltage, via a GBL, to the BL in one or more sectors during erase and program operations (410). The high voltage may be repeatedly provided to the one or more sectors as desired for program or erase operations (415).

In one embodiment, providing high voltage comprises providing a first high voltage to a selected sector and providing a second high voltage that is less than the first high voltage to a de-selected sector. For example, the first high voltage may be about 4.3 volts and the second high voltage may about 1.2 volts during erase operations. In another example, the first high voltage may be about −3.2 volts and the second high voltage may be about 0 volts during program operations.

Method 400 further comprises preventing high voltage from being provided by the GBL to one or more sectors during the read operations (420). In one embodiment, high voltage is prevented from being provided to any sector by limiting the amount of voltage that a voltage pump (e.g., VNEG 225 or VPOS 227) provides to the sector(s) via the GBL. In this case, HV control 223 turns VNEG pump 225 and VPOS pump 227 "OFF" and applies low voltage to its outputs during low voltage operations (e.g., read operations, standby operations, or sleep operations).

Low voltage may then be provided to the BL of one or more sectors during read operations, active operations, standby operations, or sleep operations. (430). The low voltage may be repeatedly provided to the one or more sectors as desired for read operations (435).

The invention claimed is:

1. A memory device, comprising:
an n-channel metal oxide semiconductor field-effect transistor (nMOSFET);
a silicon-oxide-nitride-oxide silicon (SONOS) transistor coupled to the nMOSFET; and
an isolated sector p-well (SPW) coupled to the nMOSFET and the SONOS transistor,
wherein the nMOSFET is coupled to a vertical bit line (BL) and is configured to isolate the SONOS transistor from the BL when the SONOS transistor is deselected during a read operation.

2. The memory device of claim 1, wherein:
the nMOSFET comprises a first source, a first gate, and a first drain; and
the SONOS transistor comprises a second source, a second gate, and a second drain coupled to the first source.

3. The memory device of claim 2, further comprising:
a horizontal word line (WL) coupled to the first gate;
a horizontal SONOS word line (WLS) coupled to the second gate;
a vertical local source line (SL) coupled to the second source; and
wherein the BL is coupled to the first drain, the BL configured to provide low voltage to the first drain during read operations.

4. The memory device of claim 3, further comprising:
a first voltage input coupled to the WL;
a second voltage input coupled to the WLS;
a third voltage input coupled to the SL;
a fourth voltage input coupled to the isolated SPW; and
a current output coupled to the BL.

5. A non-volatile (NV) memory, comprising:
an array of memory devices divided into a plurality of paired sectors;
a global bit line (GBL) coupled to each of the plurality of sectors, the GBL configured to provide high voltage to each respective sector during erase and program operations; and
a plurality of local bit lines (BL) coupled to a plurality of memory devices in a column in the plurality of paired sectors; and
a plurality of sense amplifiers, each sense amplifier coupled between a respective pair of sectors,
wherein during a read operation the plurality of sense amplifiers reads the plurality of memory devices through the BL.

6. The NV memory of claim 5, wherein each memory device comprises:
an n-channel metal oxide semiconductor field-effect transistor (nMOSFET);
a silicon-oxide-nitride-oxide silicon (SONOS) transistor coupled to the nMOSFET; and
an isolated p-well (SPW) coupled to the nMOSFET and the SONOS transistor.

7. The NV memory of claim 6, wherein:
the nMOSFET comprises a first source, a first gate, and a first drain; and
the SONOS transistor comprises a second source, a second gate, and a second drain coupled to the first source.

8. The NV memory of claim 7, wherein each memory device further comprises:
a first word line (WL) coupled to the first gate;
a second word line (WLS) coupled to the second gate;
a local source line (SL) coupled to the second source; and
wherein the BL is coupled to the first drain, and is configured to provide low voltage to the first drain during read operations.

9. The NV memory of claim 8, wherein each memory device further comprises:
a first voltage input coupled to the WL;
a second voltage input coupled to the WLS;
a third voltage input coupled to the SL;
a fourth voltage input coupled to the isolated (SPW); and
a current output coupled to the BL.

10. The NV memory of claim 8, wherein the plurality of sense amplifiers are coupled to each BL in the paired sector.

11. The NV memory of claim 7, wherein each sense amplifier comprises:
- a first multiplexer (MUX) coupled to the second source of each memory device in a first sector;
- a second MUX coupled to the second source of each memory device in a second sector; and
- a sense amplifier comprising a first input coupled to the first MUX, a second input coupled to the second MUX, and an output coupled to the voltage output.

12. The NV memory of claim 5, comprising a number of paired sectors in the range of four paired sectors and sixty-four paired sectors.

13. The NV memory of claim 12, wherein at least one pair of the paired sectors is a supervisor memory sector for the flash memory.

14. The NV memory of claim 5, wherein each sector comprises:
- a plurality of rows of the memory devices; and
- a plurality of columns of the memory devices.

15. The NV memory of claim 14, wherein:
- the plurality of rows of the memory devices comprises a number of rows of the memory devices in the range of 2 rows of the memory devices and 1024 rows of the memory devices; and
- the plurality of columns of the memory devices comprises a number of columns of the memory devices in the range of eight columns of the memory devices and 16384 columns of the memory devices.

16. The NV memory of claim 15, wherein each sector comprises 256 rows of the memory devices and 4096 columns of the memory devices.

17. A method for operating a flash memory system comprising an array of memory devices divided into a plurality of paired sectors, a global bit line (GBL) coupled to each of the plurality of sectors, and a local bit line (BL) coupled to each memory device, the method comprising:
- providing high voltage to the BL in any or all sectors during erase and program operations, the high voltage provided by the GBL;
- providing low voltage from a sense amplifier through the BL to a number of memory devices in any or all sectors during read operations.

18. The method of claim 17, further comprising preventing high voltage from being provided by the GBL to each sector during read operations.

19. The method of claim 17, wherein providing the high voltage comprises providing a first voltage to a selected sector via the GBL and providing a second voltage to a de-selected sector via the GBL, wherein:
- the first voltage is greater than the second voltage during erase operations; and
- the second voltage is greater than the first voltage during program operations.

20. The method of claim 19, wherein:
- the first high voltage is about 4.3 volts and the second high voltage is about 1.2 volts during erase operations; and
- the first high voltage is about −3.2 volts and the second high voltage is about 0 volts during program operations.

* * * * *

UNITED STATES PATENT AND TRADEMARK OFFICE
CERTIFICATE OF CORRECTION

| | |
|---|---|
| PATENT NO. | : 8,908,438 B1 |
| APPLICATION NO. | : 14/066431 |
| DATED | : December 9, 2014 |
| INVENTOR(S) | : Ryan T. Hirose et al. |

It is certified that error appears in the above-identified patent and that said Letters Patent is hereby corrected as shown below:

On the title page, the illustrative figure and in the drawings, sheet 1 of 4, FIG. 1, numbers in the first row and third column of the table '3.2/0.6/0' should read -- '-3.2/0.6/0' --.

Signed and Sealed this
Second Day of August, 2016

Michelle K. Lee
*Director of the United States Patent and Trademark Office*